United States Patent [19]

Dershem

[11] Patent Number: 4,968,738
[45] Date of Patent: Nov. 6, 1990

[54] SILVER-GLASS DIE ATTACH PASTE WITH REDUCED RESIN

[75] Inventor: Stephen M. Dershem, Santee, Calif.

[73] Assignee: Quantum Materials, Inc., San Diego, Calif.

[21] Appl. No.: 334,307

[22] Filed: Apr. 6, 1989

[51] Int. Cl.$^5$ ............................................. C08K 3/08
[52] U.S. Cl. .................... 524/317; 524/439; 524/558
[58] Field of Search ............... 524/439, 317, 560, 561, 524/558, 492; 106/1.14, 1.19; 252/514; 526/319, 321

[56] References Cited

U.S. PATENT DOCUMENTS

| | | | |
|---|---|---|---|
| 3,838,071 | 9/1974 | Amin | 106/1.14 |
| 3,862,894 | 1/1975 | McGuire et al. | 524/517 |
| 4,235,644 | 11/1980 | Needes | 106/1.19 |
| 4,269,959 | 5/1981 | Lawton | 526/323.2 |
| 4,419,279 | 12/1983 | Abrams | 524/439 |
| 4,468,251 | 8/1984 | Hausselt et al. | 106/1.14 |
| 4,605,717 | 8/1986 | Heitner | 526/323.2 |
| 4,649,062 | 3/1987 | Kosiorek et al. | 526/310 |
| 4,711,913 | 12/1987 | Tateosian et al. | 524/430 |
| 4,761,224 | 8/1988 | Husson, Jr. et al. | 106/1.14 |
| 4,765,929 | 8/1988 | Shaffer | 524/439 |
| 4,777,199 | 10/1988 | Ishii et al. | 524/439 |

OTHER PUBLICATIONS

Billmeyer, Fred W., "Textbook of Polymer Science", 3rd Ed., John Wiley & Sons, New York, 1984, pp. 138–139.

Primary Examiner—Joseph L. Schofer
Assistant Examiner—R. H. Delmendo
Attorney, Agent, or Firm—Baker, Maxham, Jester & Meador

[57] ABSTRACT

Glass frit and silver particles are combined with a vehicle gel comprising a cross-linked resin dispersed in an organic solvent. The resin comprises a polymerized monomer selected from a first group consisting of $C_1$ to $C_4$ alkyl methacrylates and mixtures thereof and from a second group consisting of glycol dimethacrylates and mixtures thereof. The paste may consist of 60 to 80 weight percent silver particles, 12 to 20 weight percent glass frit and 8 to 20 weight percent vehicle gel. The resin content of the vehicle gel may be one to ten weight percent.

9 Claims, No Drawings

SILVER-GLASS DIE ATTACH PASTE WITH REDUCED RESIN

BACKGROUND OF THE INVENTION

The present invention relates to the art of packaging semiconductor devices, and more particularly, to an improved silver-glass paste which is deposited in a viscous state between a die and a ceramic substrate and then fired to form a secure bond therebetween.

Silver-glass pastes have been used for a number of years to attach silicon die to ceramic substrates. U.S. Pat. Nos. 3,497,774 of Hornberger et al.; 4,101,767 of Dietz et al.; and 4,761,224 of Husson et al. disclose examples of such pastes. Typically they include a high lead glass frit, silver particles and a suitable organic vehicle. This vehicle is typically made of a resin and a solvent. During an initial drying phase the liquid vehicle evaporates. Upon firing, the remaining organic vehicle, i.e. the resin, decomposes, the glass softens to wet the ceramic and the silver flake sinters together.

The principal reason for using a resin in the organic vehicle of a die attach paste is for solvent spread attenuation. If only a solvent were used it would quickly spread across the surface of the ceramic substrate carrying glass and silver particles with it. The resin provides a suitable entrainment mechanism that retards such solvent spread.

The traditional vehicle system used in silver-glass die attach pastes consists of one or more high boiling organic solvents and a resin. The combined organics are required to volatilize and/or decompose cleanly during the curing of the product to leave the silver-glass composite free of carbonized residues. The clean organic burnout requirement has essentially restricted the polymers used as resins in this system to the following categories: (1) polyalkyl methacrylates; (2) nitrocellulose (with nitrogen content $\geq$ 12.0%); (3) polyisobutylenes; and (4) polypropylene gylcols. Polymer's of alpha-methylstyrene represent a fifth potentially useful class of resins that upon thermolysis yield completely volatile decomposition products. Their use, however, would be restricted to cure under non-oxidizing conditions.

Resins have been shown to impart the following beneficial properties in order of decreasing importance: (1) reduction in solvent bleed from the perimeter of the uncured paste fillet; (2) reduction in the rate of settling of the paste solids; (3) facilitation of the dispersion and wetting of the glass and silver; and (4) provision of green strength to paste in the dried state.

Practical considerations have limited the options for resin selection. The polyalkyl methacrylates have been shown to possess the best blend of properties for use in die attach application. The preferred methacrylate polymers include those generated from esters of the lower alcohols (i.e. where the alkyl is methyl, ethyl, propyl or butyl).

Use of the commercially available polyalkyl methacrylates has proven to be problematic. It has been demonstrated that whenever sufficient methacrylate resin was used to curb solvent spread that the resulting pastes had excessive tailing when dispensed from automatic die bond equipment. Tailing or stringiness has a major negative impact on the application of these pastes, especially when they are dispensed from equipment configured with a starfish nozzle. The downsides from this problem included a reduction of product throughput and/or an increased yield loss neither of which could be tolerated by paste users.

It is well known that the molecular weight of the polymer used has a pronounced effect on solvent spread. Generally the higher the molecular weight the lower the degree of solvent spread for any given weight percent of resin dissolved in the vehicle solvent. Presumably, the dispensability of the paste could be improved by incorporation of the minimum amount of high molecular weight resin capable of solvent spread attenuation. Unfortunately, this approach is thwarted by the simultaneous increase in stringiness of the polyalkyl methacrylates as molecular weight is increased. A paste formulation based on the commercial methacrylate resins must of necessity represent a compromise between low solvent spread and acceptable dispensing properties which cannot be simultaneously optimized.

SUMMARY OF THE INVENTION

It is therefore the primary object of the present invention to provide an improved silver-glass die attach paste with relatively low resin content and the preferred rheology for automatic dispensing.

According to the present invention, glass frit and silver particles are combined with a vehicle gel comprising a cross-linked resin dispersed in an organic solvent. The resin comprises a polymerized monomer selected from a first group consisting of $C_1$ to $C_4$ alkyl methacrylates and mixtures thereof and from a second group consisting of glycol dimethacrylates and mixtures thereof. The paste may consist of 60 to 80 weight percent silver particles, 12 to 20 weight percent glass frit and 8 to 20 weight percent vehicle gel. The resin content of the vehicle gel may be one to ten weight percent

DESCRIPTION OF THE PREFERRED EMBODIMENTS

The entire disclosure of U.S. Pat. No. 4,761,224 of Husson, Jr. et al. entitled SILVER-GLASS PASTE WITH POLY-MODAL FLAKE SIZE DISTRIBUTION AND QUICK DRY VEHICLE granted Aug. 2, 1988 is specifically incorporated herein by reference.

Unless otherwise specified, all percentages herein are given by weight.

The vehicle system employed in the present invention comprises gels which are analogous to the synthetic hydrogels which have found numerous applications in biomedicine. Unlike the hydrogels which are water-based, the gel vehicles of the present invention comprise dispersions of a cross-linked resin in an organic solvent. The resins are derived from hydrophobic alkyl methacrylate monomer and glycol dimethacrylate monomer with the latter being incorporated as a cross-linking agent.

Several features distinguish the gel vehicles of the present invention from commercially available solutions of linear polyalkyl methacrylates. For example, the three dimensional polymer network present in the gels of the invention not only lends rigidity to the intact gel vehicle but when the gel is pulverized, as in a three roll milling operation, a thinner but still gel-like consistency is retained. Thus, it is possible to generate gel based vehicles with higher intrinsic viscosity and lower resin loading than has been possible using commercially available methacrylate polymers. The term "resin loading" as used herein refers to the weight% of resin present in the gel. The increased viscosity of the gel vehicles translates into reduced rate of settling when the vehicles are incorporated into die attach paste formulations. Another unique property possessed by the gel vehicles of the invention depends on the tendency of the cross-linked resin contained therein to swell rather than dissolve in vehicle solvent. Accordingly, a milled gel of the present invention more closely resembles a viscous dispersion of microscopic sponge-like particles than a solution of dissolved resin. Because of this feature, the gel based vehicles of the invention yield pastes with reduced tailing which is a direct result of the dispersed particulate nature of the vehicle. In contrast, a solution of a linear polyalkyl methacrylate of equivalent viscosity would have a stringy character that would contribute to excessive tailing in the paste.

A major improvement in the performance of the gel based vehicles of the invention was attained when a method to maximize the molecular weight of the cross-linked gel polymer was utilized. It was found that when the cross-linked resin was obtained by solution polymerization conducted at or below room temperature, solvent retention of the resulting resin was enhanced. It is well known that lower polymerization temperatures for a given initiator/monomer combination favor higher molecular weight since the same initiator radicals that start the polymerization sequence also terminate it. A low but sustained concentration of initiator free radicals therefore provides the optimum condition for creation of a high molecular weight polymer in good yield. An unfortunate consequence of low temperature polymerization is that the reaction time for gel formation requires several days. The half-life of the preferred initiator, i.e. 2,2-azobis (2,4-dimethyl-pentanenitrile), at 25° C. is greater than thirty-two days. At 25° C., the reaction time for complete gelation is from seven to ten days, however, the surplus initiator serves as a reservoir of free radicals and assures that the reaction proceeds to completion.

A preferred method for the production of the cross-linked resins of the invention is suspension polymerization. The absence of solvent in suspension polymerization translates into further enhancement of molecular weight since, to varying degrees, all solvents can act as chain transfer agents and thus terminate growing polymer chains. Suspension polymerization is carried out by stirring a mixture of monomer(s), cross-linking agent and initiator in a non-solvent such as water. Both the reactive monomers and the initiator should not have appreciable solubility in the aqueous suspending medium. The organic phase is kept in suspension as miniature droplets by the action of the stirrer. Suspending agents and/or stabilizing colloids must be added to prevent the droplets from coalescing. Preferred stabilizing colloids are polymers of ethylene oxide. By way of example, any of the various grades of POLYOX water soluble poly(ethylene oxide) resins available from Union Carbide can be used.

Suitable polymerization initiators that may be employed in both solution and suspension polymerization include peroxides, azonitriles and other materials than can be converted to free radicals under suitable polymerization conditions. The preferred initiator, for use in both solution and suspension polymerization is VAZO 52 -2,2'-azobis (2,4-dimethylpentanenitrile) which is available from Du Pont. This azo type inititor has the dual advantage of negligible water solubility and low temperature activity.

Suspension polymerization differs from solution polymerization not only in the absence of solvent, but also in the percentage of cross-linking agent used. With respect to suspension polymerization, it has been found that the concentration of cross-linking agent as a fraction of total monomer present should range from 0.002% (20 parts per million) to two percent by weight. At less than 0.002% cross-linker, very stringy, linear resins are produced. Above the upper limit, resins with low solvent imbibe capacity are generated. The preferred concentration of cross-linking agent in solution polymerization is, by contrast, two to fifty percent by weight of the total monomer present.

The recommended temperature range for conducting both solution and suspension polymerizations according to the present invention is 10–30° C. with the preferred range being 20° to 25° C.

Cross-linked resin produced by suspension polymerization is obtained as hard beads ranging in size from 45 micrometers to greater than one millimeter. The particles can be classified by sieving, but generally this is not necessary. Prior to use in a paste, the resin beads are swollen in the desired solvent(s) with the aid of heat and agitation to yield a grainy gel vehicle. These resins, derived from suspension polymerization, are similar in all respects to the solution polymerized resins once the solvent imbibing process achieves equilibrium.

The resins utilized in the present invention are methacrylic polymers comprising polymerized monomer selected from a first group consisting of $C_1$ to $C_4$ alkyl methacrylates and mixtures thereof and from a second group consisting of glycol dimethacrylates and mixtures thereof. The gel vehicles of the present invention can contain one or more of these methacrylic resins The term "$C_1$ to $C_4$ alkyl methacrylates" as used herein refers to the methyl, ethyl, propyl, isopropyl, butyl and tert-butyl esters of methacrylic acid. The term "glycol dimethacrylates" as used herein refers to bis methyacrylate esters of long chain aliphalic diols. Suitable diols include, for example, 1,6-hexanediol and polyglycols such as polyethylene glycol, polypropylene glycol and the like. Use of long chain glycol dimethacrylates as cross-linking agents in the present invention increases the capacity of resins incorporating such agents to imbibe solvent. The term "imbibe" as used herein refers to the ability of collapsed pores in the resin in the dry state to take on solvent. Extensive solvation causes the resin to swell and results in the reappearance of the pores. An added benefit of utilizing these cross linkers is the decrease in the elastic modulus of the gel which is thought to reduce stress at the paste/die and paste/substrate bond during curing.

Preferred organic solvents which can be used to disperse the cross-linked resins of the invention are selected from the group consisting of 2,2,4-trimethyl-1,3-pentanediol monoisobutyrate, glycol ethers such as propylene glycol monomethyl ether, dipropylene glycol monomethyl ether and tripropylene glycol monomethyl ether, glycol ether esters such as propylene glycol monomethyl ether acetate, dipropylene glycol monomethyl ether acetate and aliphatic hydrocarbons such as nonane, decane, undecane, dodecane, tetradecane, hexadecane, and mixtures thereof.

The resin content of the vehicle gel is normally 1 to 10 weight percent. A preferred range is 1 to 6 weight percent.

Use of the high molecular resins of the invention permits tangible improvements in paste performance. It is found that the increase in solvent imbibe capacity provides better paste properties at much lower resin loadings compared to the use of linear polyalkyl methacrylates. Specifically, the resin content in the attach paste formulations can be reduced to as little as one to two percent of the vehicle organics without creating excessive solvent spread. This concentration of resin is dramatically less than the four to eleven percent usually required. The lowered resin level provides a paste with the following advantages: (1) increased rate of residue burn-out; (2) improved solvent release; and (3) higher thixotropic index.

EXAMPLE I

The following example illustrates preparation of a cross-linked resin by means of solution polymerization.

A reaction mixture of 0.5 g 2,2'-azobis (2,4-dimethylpentanenitrile) 1.92 g 1,6-hexanediol dimethacrylate, and 46.08 g isobutyl methacrylate in 251.5 g of 2,2,-4-trimethyl-1,3-pentanediol monoisobutyrate was stirred continuously while purging with a stream of nitrogen gas. The reaction is conducted at 20°–25° C. for 250 hours. Appearance of a gel structure is seen within the first 60 hours. Excess initiator is destroyed at the end of the reaction period by heating the reaction mixture at 60° C. for ten hours.

Approximately 0.81 weight percent of the resulting gel vehicle is blended with silver particles, glass frit, and sufficient solvent(s) to adjust the resin content to 0.13 weight percent of the total paste composition (paste solids=87.0%). This mixture is homogenized using a three roll mill to give a smooth silver paste.

It is desirable, but not absolutely necessary, to remove residual inhibitors from the monomers just prior to use.

EXAMPLE II

The following example illustrates preparation of a cross-linked resin by means of suspension polymerization.

A mixture of 49 g isobutylmethacrylate, 1 g of 0.5% 1,6 - hexanediol dimethacrylate (in isobutyl methacrylate), 0.15 g 2,2'-azobis (2,4-dimethylpentane nitrile), and 5.0 g of polyethylene oxide (2.0% WSR N-60K POLYOX, obtained from Union Carbide) in 245 ml of 18 megohm water was stirred continuously. The size of the comonomer droplets is directly proportional to the rate of stirring. Stirring speed is increased until all of the droplets are approximately equal to or less than one millimeter in diameter. The reaction is conducted at 20° to 25° C. under a constant stream of nitrogen gas. Excess initiator is destroyed after 120 hours by heating the mixture at 60° C. for an additional ten hours. The resin/water slurry is then poured onto a tier of sieves consisting of 50, 100 and 400 mesh from top to bottom. The resin beads are simultaneously washed and fractionated by passing copious volumes of tap water through the stacked screens. A final rinse with 18 megohm water is used to wash away the last traces of POLYOX and any inorganic residues from tap water. The resin is dried at 60° C. in an air circulating oven.

A semi-rigid, granular vehicle gel is made from the above obtained resin by stirring 4 g of the resin beads in 196 g of 2,2,4-trimethyl-1,3-pentanediol monoisobutyrate at 80° C. Several hours of heat and stirring are required for the solvent imbibition of the resin to reach equilibrium. A marker for this condition is the conversion of the mixture from a translucent to a transparent state with respect to transmitted light.

Eight to 20 weight percent of this gel is then used directly as a paste vehicle in combination with silver particles and a low softening point glass.

While I have described several preferred embodiments of my silver-glass paste with reduced resin content, it should be understood that modifications and adaptations thereof will occur to persons skilled in the art. Therefore, the protection afforded my invention should only be limited in accordance with the scope of the following claims.

I claim:

1. A paste for attaching a die to a ceramic substrate, comprising:
   60 to 80 weight percent silver particles having a tap density greater than 2.8 g/cc and less than 5.0 g/cc;
   12 to 20 weight percent glass frit having a softening point of less than 400 degrees C.;
   8 to 20 weight percent vehicle gel comprising a cross-linked resin dispersed in an organic solvent, said resin comprising a polymerized monomer selected from a first group consisting of $C_1$ to $C_4$ alkyl methacrylates and mixtures thereof and from a second group consisting of glycol dimethacrylates and mixtures thereof.

2. A paste according to claim 1 wherein said second group of monomers consists of 1,6-hexanediol dimethacrylate, polyethylene glycol dimethacrylates, propylene glycol dimethacrylates and mixtures thereof.

3. A paste according to claim 2 said resin is a copolymer of isobutyl methacrylate and 1,6-hexanediol dimethacrylate.

4. A paste according to claim 3 wherein said solvent is 2,2,4-trimethyl-1,3-pentanediol monoisobutyrate.

5. A paste according to claim 1 wherein said resin comprises 1 to 10 weight percent of said gel.

6. A paste according to claim 1 wherein said solvent is selected from the group consisting of 2,2,4-trimethyl-1,3-pentanediol monoisobutyrate, propylene glycol monomethyl ether, dipropylene glycol monomethyl-ether, tripropylene glycol monomethyl ether, propylene glycol monomethyl ether acetate, dipropylene glycol monomethyl ether acetate, nonane, decane, undecane, dodocane, tetradecane, hexadecane.

7. An attach paste comprising:
   60 to 80 weight percent silver particles having a tap density greater than 2.8 g/cc and less than 5.0 g/cc;
   12 to 20 weight percent glass frit having a softening point of less than 400 degrees C.; and
   80 to 20 weight percent vehicle comprising cross-linked resin dispersed in an organic solvent, said resin obtained by copolymerization of monomer selected from a first group consisting of $C_1$ to $C_4$ alkyl methacrylates and mixtures thereof and from a second group consisting of glycol dimethacrylates and mixtures thereof.

8. A paste according to claim 7 wherein said glycol dimethacrylates are selected from 1,6-hexanediol dimethacrylate, polyethylene glycol dimethacrylates, propylene glycol dimethacrylates and mixtures thereof.

9. A paste according to claim 7 wherein said resin comprises 1 to 10 weight percent of said vehicle.

* * * * *

UNITED STATES PATENT AND TRADEMARK OFFICE
CERTIFICATE OF CORRECTION

PATENT NO. : 4,968,738

DATED : November 6, 1990

INVENTOR(S) : Stephen M. Dershem

It is certified that error appears in the above—identified patent and that said Letters Patent is hereby corrected as shown below:

In claim 7, column 6, line 52, delete "80" and insert therefore -- 8 --.

Signed and Sealed this

Ninth Day of February, 1993

Attest:

STEPHEN G. KUNIN

*Attesting Officer*   Acting Commissioner of Patents and Trademarks